US012805341B2

United States Patent

Chung et al.

(12) United States Patent
(10) Patent No.: US 12,805,341 B2
(45) Date of Patent: Nov. 17, 2026

(54) SILICON-CONTAINING DIELECTRIC BOND FILMS FOR REDUCED THERMAL RESISTANCE AND METHODS FORMING THE SAME

(71) Applicant: Taiwan Semiconductor Manufacturing Co., Ltd., Hsinchu (TW)

(72) Inventors: Ming-Tsu Chung, Hsinchu (TW); Kuang-Wei Cheng, Hsinchu (TW); Yung-Chi Lin, Su-Lin City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 633 days.

(21) Appl. No.: 18/314,356

(22) Filed: May 9, 2023

(65) Prior Publication Data

US 2024/0379505 A1 Nov. 14, 2024

(51) Int. Cl.

| | |
|---|---|
| ***H10W 70/40*** | (2026.01) |
| ***H10P 10/00*** | (2026.01) |
| ***H10P 14/61*** | (2026.01) |
| ***H10P 50/26*** | (2026.01) |

(52) U.S. Cl.

CPC ......... *H10W 70/417* (2026.01); *H10P 10/128* (2026.01); *H10P 14/61* (2026.01); *H10P 50/268* (2026.01)

(58) Field of Classification Search

CPC . H01L 23/49513; H01L 21/187; H01L 21/32; H01L 21/32137; H10W 70/417; H10P 10/128; H10P 14/61; H10P 50/268

See application file for complete search history.

(56) References Cited

U.S. PATENT DOCUMENTS

2022/0344301 A1* 10/2022 Yu ......................... H10W 99/00
2022/0367407 A1 11/2022 Lin et al.
2024/0363359 A1* 10/2024 Chung .................... H10P 50/73

FOREIGN PATENT DOCUMENTS

TW I781514 B 10/2022

* cited by examiner

*Primary Examiner* — John P. Dulka
(74) *Attorney, Agent, or Firm* — Slater Matsil, LLP

(57) ABSTRACT

A method includes forming feature for a first package component, and the forming the feature includes a planarization process to level a top surface of the feature. A silicon-containing dielectric layer is deposited over and contacting the feature, and as a surface feature of the first package component. A second package component is bonded to the silicon-containing dielectric layer through fusion bonding. The silicon-containing dielectric layer has a same thickness in both steps of the depositing and the fusion bonding.

20 Claims, 21 Drawing Sheets

SILICON-CONTAINING DIELECTRIC BOND FILMS FOR REDUCED THERMAL RESISTANCE AND METHODS FORMING THE SAME

BACKGROUND

Fusion bonding is a common bonding scheme for bonding two package components such as wafers and/or dies to each other. In the bonding process, the package components are first bonded through pre-bonding at a lower temperature, and then a bonding process is performed at a higher temperature to bond the package components together.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
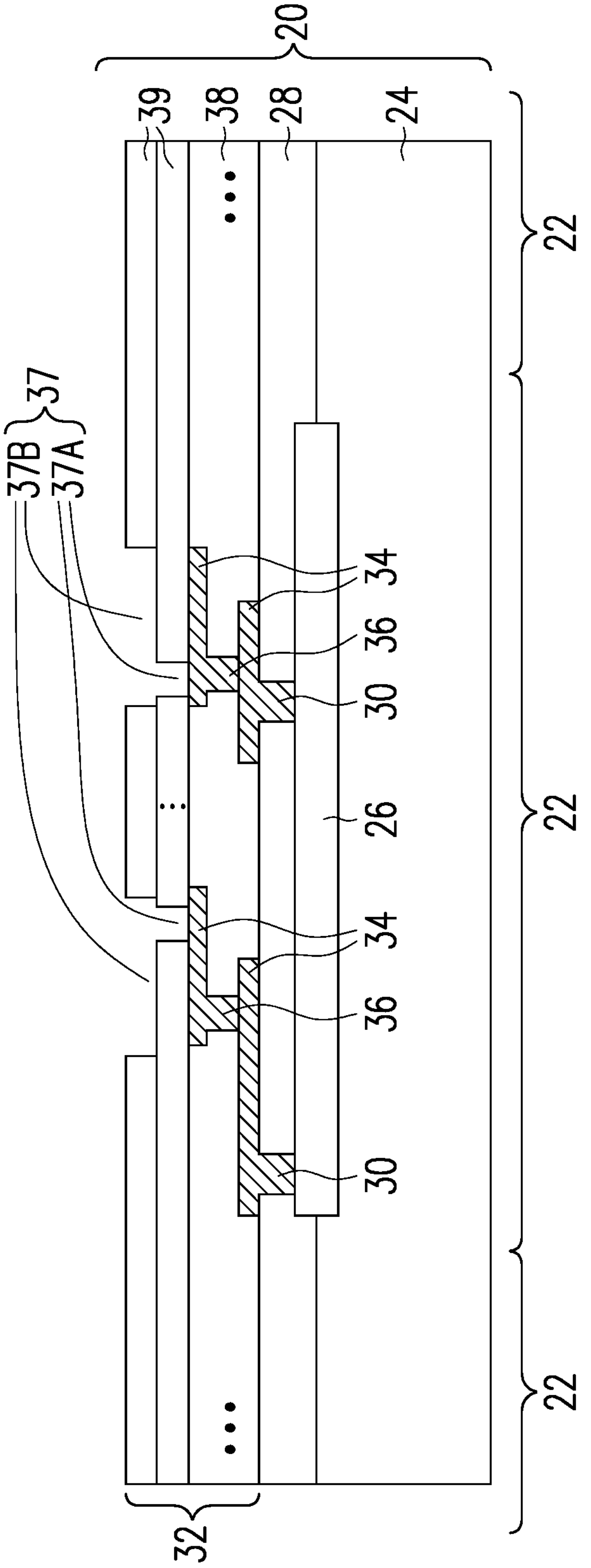
FIGS. 1-3, 4A, 4B-1, 4B-2, 5A, 5B, 6, 7, and 8A illustrate the cross-sectional views of intermediate stages in the formation of packages including fusion bonding processes in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the package through fusion bonding are provided. In accordance with some embodiments, a planar surface of a package component is formed. A thin bond film is deposited on the planar surface. The process for forming the bond film is controlled, so that the surface of the thin bond film is Si—OH rich. The thin bond film is deposited through atomic layer deposition, and the thickness is small. The surface roughness of the bond film is small, so that no planarization process needs to be performed on the thin bond film, while the surface roughness of the bond film is adequately small for bonding the package component to another package component through fusion bonding. The Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-3, 4A, 4B-1, 4B-2, 5A, 5B, 6, 7, and 8A illustrate the cross-sectional views of intermediate stages in the formation of packages including fusion bonding processes in accordance with some embodiments. The corresponding processes are also reflected schematically in the process flow shown in FIG. 18.

FIG. 1 illustrates a cross-sectional view of package component 20. In accordance with some embodiments, package component 20 is or comprises a device wafer including active devices and possibly passive devices, which are represented as integrated circuit devices 26. Package component 20 may include a plurality of dies 22 therein, with the details of one of dies 22 being illustrated. In accordance with alternative embodiments, package component 20 is an interposer wafer, which is free from active devices, and may or may not include passive devices. In accordance with yet alternative embodiments, package component 20 is or comprises a package such as an Integrated Fan-Out (InFO) Package. For example, package component 20 may be a reconstructed wafer, which includes device dies and/or a wafer(s) bonded together and encapsulated in an encapsulant(s) such as molding compound. Package component 20 may also be a silicon carrier, which may be free from metal features (except alignment marks) and active devices therein.

Package component 20, instead of being at wafer level, may also be at die level, and may be a device die, an interposer die, a discrete package (that has been sawed from a reconstructed wafer), or the like. In subsequent discussion, a device wafer is discussed as an example of package component 20, and package component 20 may also be referred to as wafer 20. The embodiments may also be applied on interposer wafers, reconstructed wafers, discrete packages, discrete device dies, discrete interposer dies, etc.

In accordance with some embodiments, wafer 20 includes semiconductor substrate 24 and the features formed at a top surface of semiconductor substrate 24. Semiconductor substrate 24 may be formed of or comprise crystalline silicon, crystalline germanium, crystalline silicon germanium, carbon-doped silicon, a III-V compound semiconductor, or the like. Semiconductor substrate 24 may also be a bulk semiconductor substrate or a Semiconductor-On-Insulator (SOI) substrate.

In accordance with some embodiments, wafer 20 includes integrated circuit devices 26, which are formed at the top surface of semiconductor substrate 24. Integrated circuit devices 26 may include Complementary Metal-Oxide Semiconductor (CMOS) transistors, resistors, capacitors, diodes, and/or the like in accordance with some embodiments. The details of integrated circuit devices 26 are not illustrated herein.

Inter-Layer Dielectric (ILD) 28 is formed over semiconductor substrate 24 and fills the spaces between the gate stacks of transistors (not shown) in integrated circuit devices 26. In accordance with some embodiments, ILD 28 is formed of Phospho Silicate Glass (PSG), Boro Silicate Glass (BSG), Boron-doped Phospho Silicate Glass (BPSG), Fluorine-doped Silicate Glass (FSG), silicon oxide, silicon oxynitride, silicon nitride, or the like. ILD 28 may be formed using spin-on coating, Flowable Chemical Vapor Deposition (FCVD), Chemical Vapor Deposition (CVD), or the like.

Contact plugs 30 are formed in ILD 28, and are used to electrically connect integrated circuit devices 26 to overlying metal lines and vias. In accordance with some embodiments, contact plugs 30 are formed of or comprise a conductive material selected from tungsten, aluminum, copper, titanium, tantalum, titanium nitride, tantalum nitride, alloys therefore, and/or multi-layers thereof.

Interconnect structure 32 is formed over ILD 28 and contact plugs 30. Interconnect structure 32 may include metal lines 34 and vias 36, which are formed in dielectric layers 38 (also referred to as Inter-metal Dielectrics (IMDs)). The metal lines at a same level are collectively referred to as a metal layer hereinafter. In accordance with some embodiments, interconnect structure 32 includes a plurality of metal layers interconnected through vias 36. Metal lines 34 and vias 36 may be formed of copper, a copper alloy, and/or another metal. In accordance with some embodiments, dielectric layers 38 are formed of low-k dielectric materials. The dielectric constants (k values) of the low-k dielectric materials may be lower than about 3.0, for example. Dielectric layers 38 may comprise a carbon-containing low-k dielectric material, Hydrogen SilsesQuioxane (HSQ), MethylSilsesQuioxane (MSQ), or the like.

Interconnect structure 32 may also include a passivation layer, which may be formed of a non-low-k dielectric material, over the low-k dielectric layers. The passivation layer may be formed of or comprise Undoped Silicate Glass (USG), silicon nitride, silicon oxide, or the like, or multi-layers thereof. There may also be metal pads (such as aluminum-copper pads), Post Passivation Interconnect (PPI), metal pads, or the like, which are referred to as conductive features.

Figure 2:
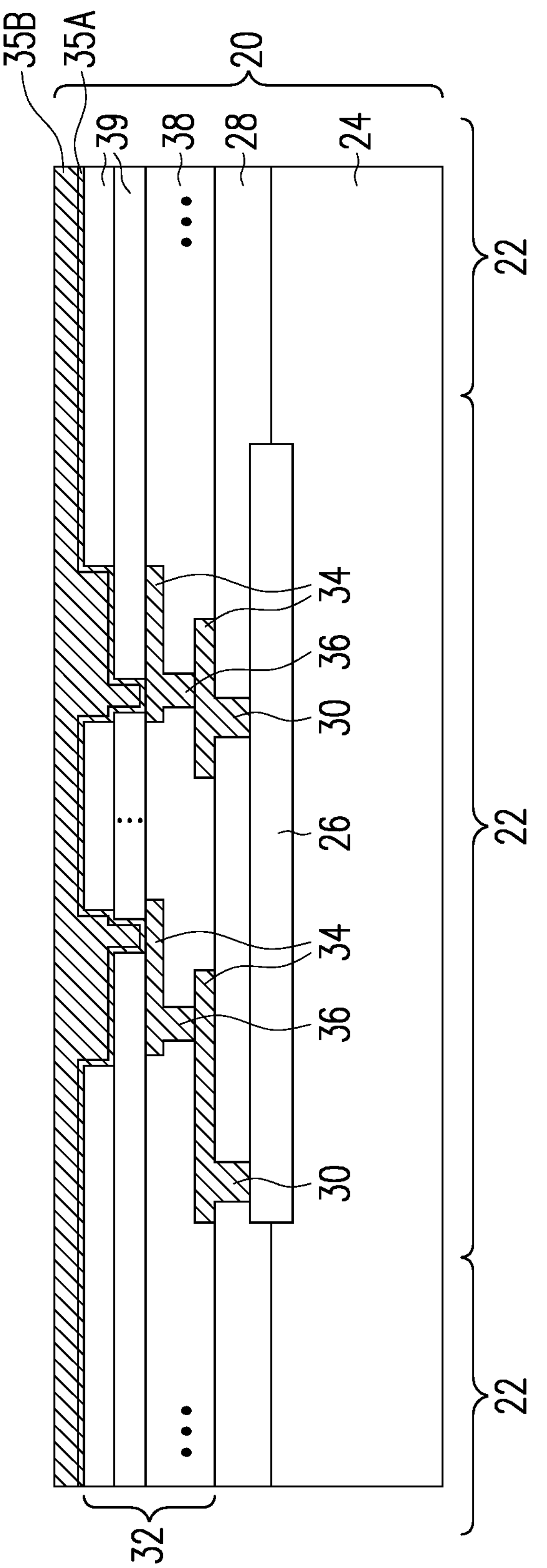
Figure 3:
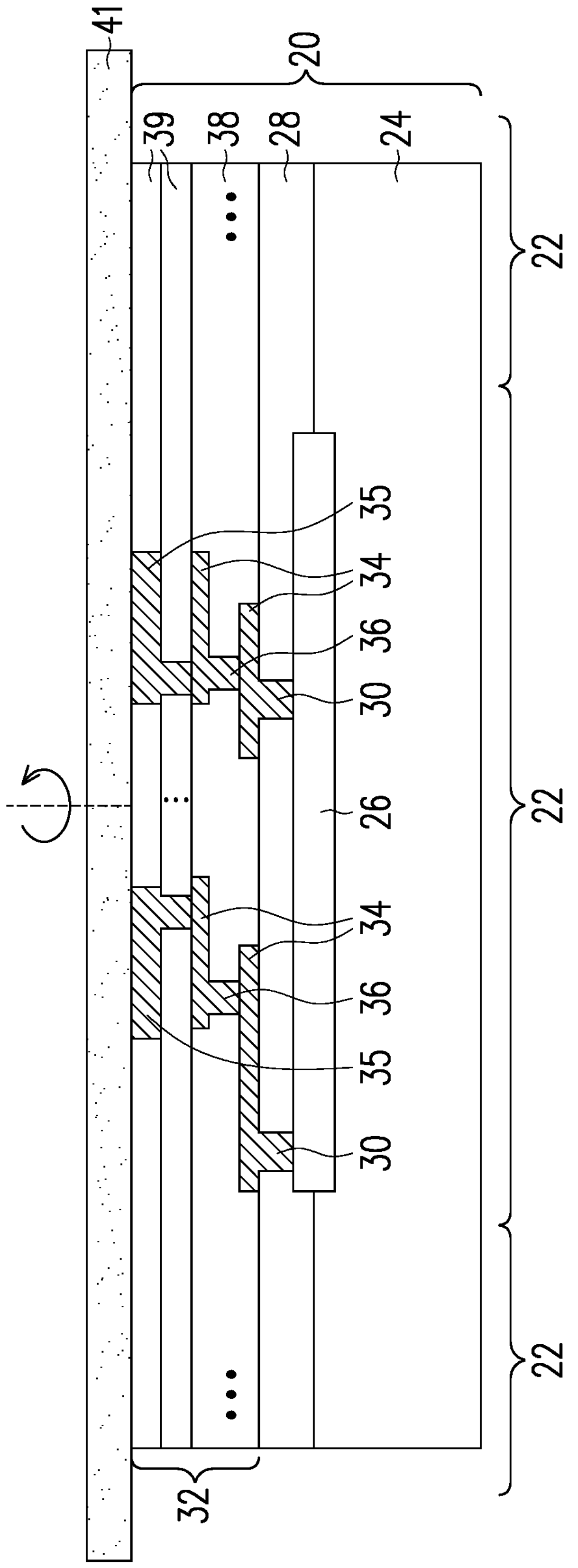

FIGS. 1 through 3 illustrate the formation of top conductive features 35 in accordance with some embodiments. As also shown in FIG. 1, dielectric layer 39 is formed. Dielectric layer 39 may be a passivation layer, and may be formed of USG, SiN, SiC, SiCN, or the like. In accordance with other embodiments, dielectric layer 39 may be formed of or comprise a low-k dielectric material. Dielectric layer 39 may be a single layer formed of a homogenous material, or may be a composite layer comprising more than one layer, for example, two dielectric layers and an etch stop layer in between.

Figure 18:
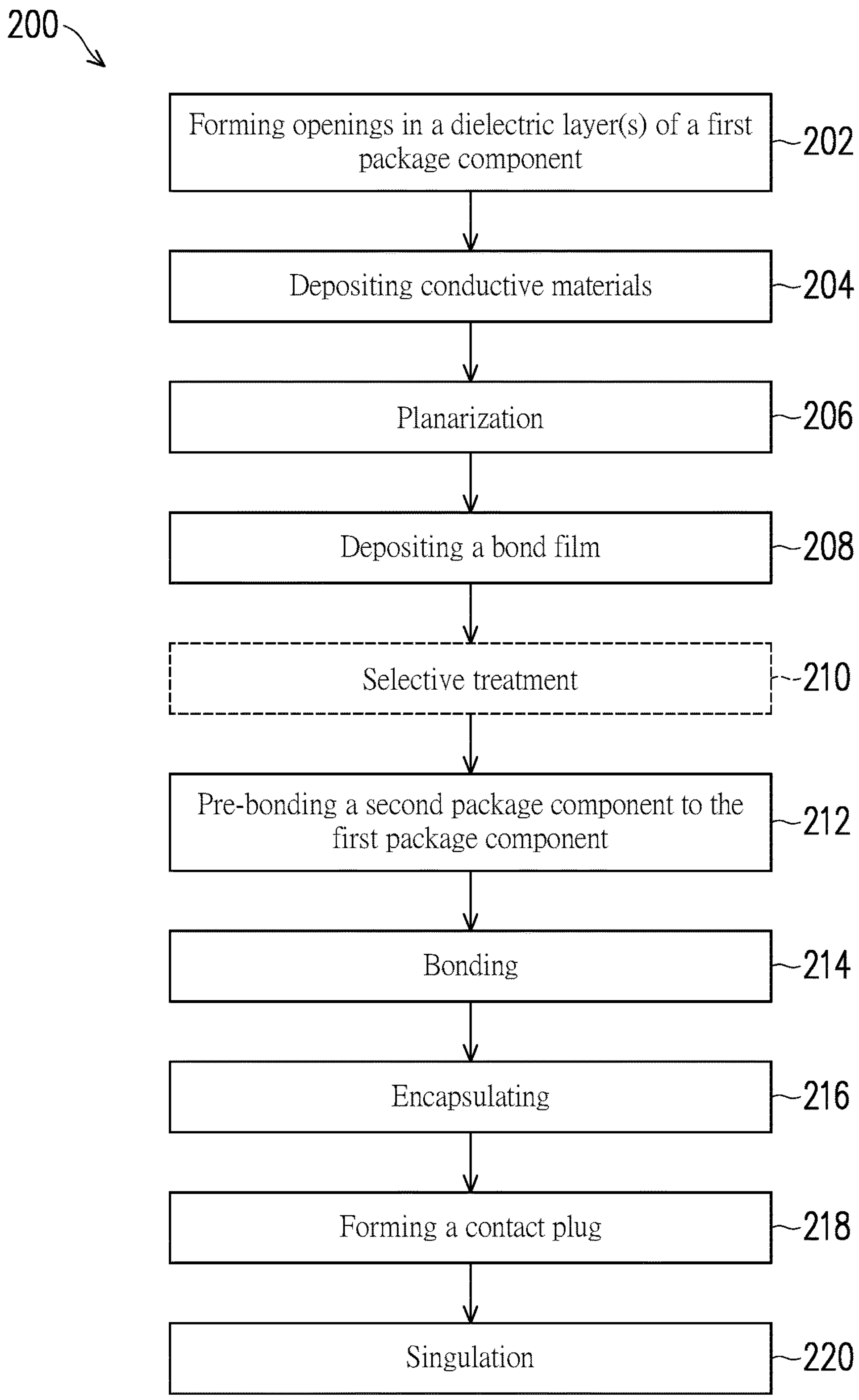
FIG. 18 illustrates a process flow for forming a package in accordance with some embodiments.

Openings 37 are formed in dielectric layer 39 through etching processes. The respective process is illustrated as process 202 in the process flow 200 as shown in FIG. 18. Openings 37 may include via openings 37A and trenches 37B.

Next, as shown in FIG. 2, conductive materials are deposited. The respective process is illustrated as process 204 in the process flow 200 as shown in FIG. 18. In accordance with some embodiments, the conductive materials include conductive diffusion barrier layer 35A and metal layer 35B. Conductive diffusion barrier layer 35A may be formed of or comprise Ti, TiN, Ta, TaN, or the like. Metal layer 35B may comprise copper, a copper alloy, aluminum, nickel, tungsten, or the like.

Referring to FIG. 3, a planarization process is performed. The respective process is illustrated as process 206 in the process flow 200 as shown in FIG. 18. The planarization process may be performed through a Chemical Mechanical Polish (CMP) process, a mechanical grinding process, or the like. For example, wafer 20 may be placed on a polishing pad 41 (in an upside-down orientation than illustrated), with both of wafer 20 and/or polishing pad 41 being rotated to planarize wafer 20. The remaining portions of conductive diffusion barrier layer 35A and metal layer 35B are referred to as conductive features 35 hereinafter. The top surfaces of conductive features 35 and dielectric layer 39 are coplanar, with as low as roughness as possible. The planarization process is controlled to achieve a good uniformity, which may be smaller than 1 percent, wherein the uniformity is the thickness uniformity of the entire layer. The surface roughness Ra and the root mean square of the surface roughness Rq may be controlled to be smaller than about 1 Å.

Figure 4A:
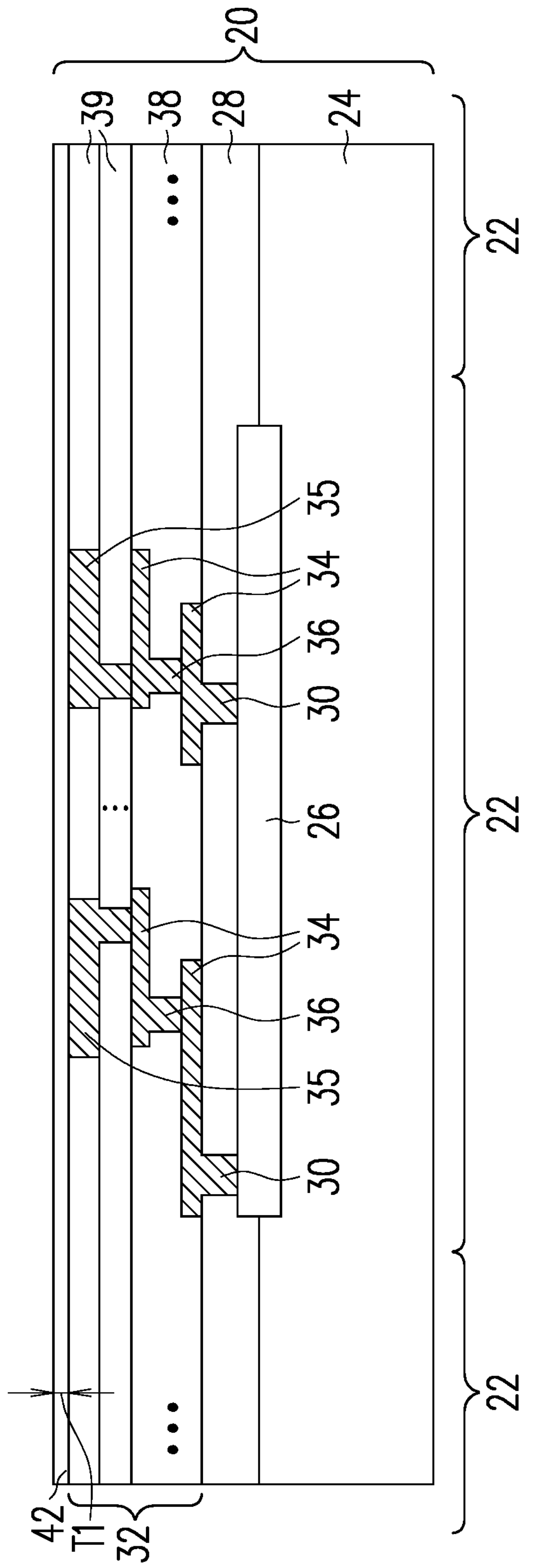

Referring to FIG. 4A, bond film 42 is deposited. The respective process is illustrated as process 208 in the process flow 200 as shown in FIG. 18. In accordance with some embodiments, bond film 42 is deposited using Atomic Layer Deposition (ALD), which may be Plasma Enhanced ALD (PECVD). In accordance with some embodiments, the PEALD process includes a plurality of cycles. Each cycle includes pulsing and then purging a first precursor, which is a silicon-containing precursor, and pulsing and then purging a second precursor comprising elements selected from oxygen, nitrogen, carbon, and the like, and combinations thereof. Each cycle further includes turning on and then turning off plasma to react the precursors. In accordance with some embodiments, the silicon-containing precursor may be selected from silane, di-silane, aminosilanes, di-sec-butylaminosilane (DSBAS), bis(tert-butylamino) silane (BTBAS), and combinations thereof. The silicon-containing precursor may or may not include oxygen and/or carbon. The second precursor may be selected from $N_2O$, $N_2$, $O_2$, and/or the like, and combinations thereof, and may or may not include carbon.

The material of bond film 42 may be expressed as $SiO_xN_yC_z$, with x being in the range between about 0 and about 2, y being in the range between about 0 and about 1.33, and z being in the range between about 0 and about 1. At least one or more of values x, y, and z is greater than zero. For example, bond film 42 may be formed of or comprises SiON, SiN, SiOCN, SiCN, SiOC, SiC, $SiO_2$, or the like.

Being deposited using the ALD (PEALD) process, and also because bond film 42 is deposited on a highly planar surface, the top surface of bond film 42 is adequately planar with small uniformity and small roughness. As a result, bond film 42 does not need to be planarized (for example, through CMP or mechanical grinding) in order to perform a subsequent bonding process. For example, the thickness uniformity of bond film 42 is smaller than 1 percent. The surface roughness Ra and the root mean square of the surface roughness Rq may also be smaller than about 1 Å. Experiment results have revealed that with bond film 42 having the uniformity smaller than 1 percent (and smaller than 5 Å), and with the roughness values Ra and Rq being smaller than 1 Å, the bonding may reach the bond strength greater than 2.5 joules/$m^2$, which is required for strong bonding.

Conventionally, bond films were deposited using Plasma Enhanced Chemical Vapor Deposition (PECVD) since the high deposition rate of PECVD may meet the requirement of the conventional thick bond films, while the deposition rate of ALD is too low to deposit thick bond films. The bond films formed using PECVD, however, have high non-uniformity value greater than 1 percent and greater than 50 Å. The corresponding roughness values Ra and Rq would also be greater than 3 Å. Such rough bond films cannot be used for bonding directly without performing planarization processes. In accordance with the embodiments of the present disclosure, the planarization process may be skipped without sacrificing the quality of bonding.

Figure 16:
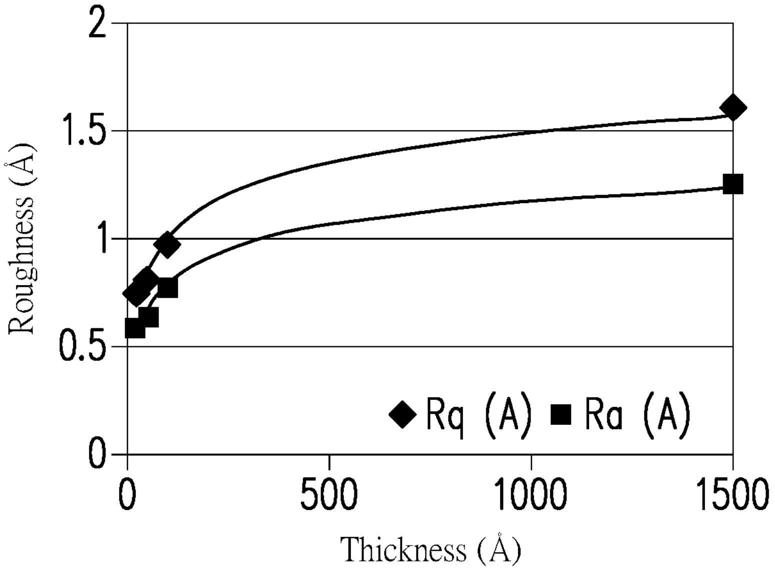
FIG. 16 illustrates the surface roughness of bond films as a function of thickness in accordance with some embodiments.

FIG. 16 illustrates the surface roughness values of deposited films as a function of thicknesses. FIG. 16 reveals that with the increase in the thickness of the deposited films, the surface roughness values Ra and Rq also increase. For example, when the thickness of the deposited are 20 Å, 50 Å, 100 Å, and 1,500 Å, respectively, the Rq values were measured as 0.738 Å, 0.797 Å, 0.961 Å, and 1.61 Å, respectively. The Ra values were measured as 0.586 Å, 0.633 Å, 0.767 Å, and 1.27 Å, respectively. Accordingly, to meet the specification that the roughness of the bond films is to be smaller than 1 Å, the thickness T1 of bond film 42 (FIG. 4A) is smaller than 100 Å, and may be smaller than about 50 Å to provide adequate process margin. The thickness T1 may also be in the range between about 20 Å and about 50 Å.

Figure 17:
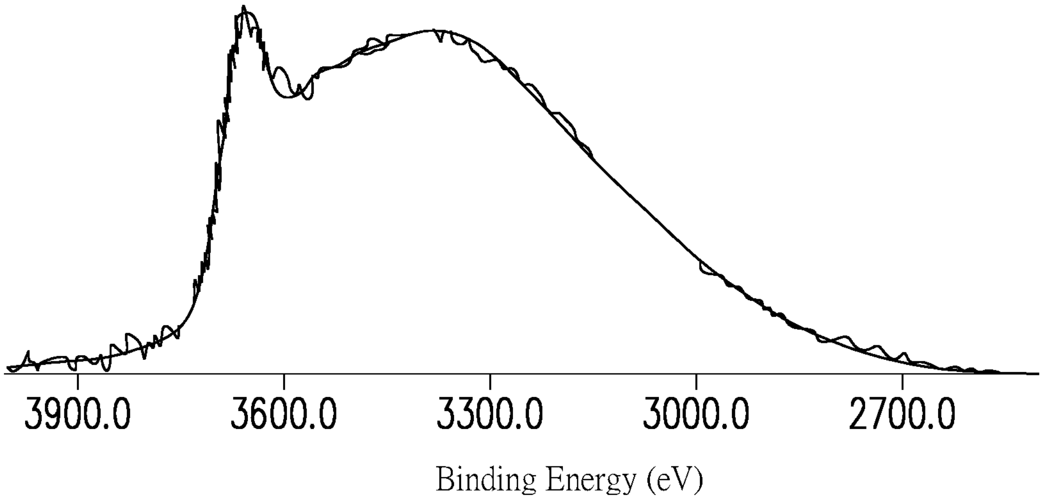
FIG. 17 illustrates the signal strength of Si—OH measured through FTIR spectroscopy in a bond film in accordance with some embodiments.

In order to achieve strong bonding, the bond film 42 is desired to be Si—OH rich (at the time of bonding). In accordance with some embodiments, being Si—OH rich, when measured using as phase FTIR spectroscopy, the ratio $SS_{SiOH}/SS_{SiO}$ is higher than 0.015, wherein $SS_{SiOH}$ is the signal strength of the Si—OH peak measured around the binding energy of 3,500 eV, and the $SS_{SiO}$ is the total signal strength of all SiO networks measured at around the binding energy of 1,100 eV. The signal strength $SS_{SiOH}$ is shown in FIG. 17, while the binding energy of 1,100 eV, at which the signal strength $SS_{SiO}$ is measured, is outside of the binding energy range shown in FIG. 17.

To make bond film 42 Si—OH rich, the percentage of $N_2O$ and $N_2$ in the second precursor for the PEALD cycles may be increased. For example, when the second precursor is conducted into the ALD chamber, the flow rate ratio of $(N_2O+N_2)/(N_2O+N_2+O_2)$ may be greater than about 0.2, and may be in the range between about 0.2 and about 1. Also, to increase the amount of the Si—OH bonds, the turn-on duration of the plasma in each PEALD cycle may be shortened, for example, shorter than about 0.5 seconds, and may be in the range between about 0 seconds and about 0.5 seconds. Furthermore, the RF power for turning on the plasma may be increased, for example, to be greater than about, 3000 watts, and may be in the range between about 3,000 watts and about 6,000 watts.

Figures 1, 4B:
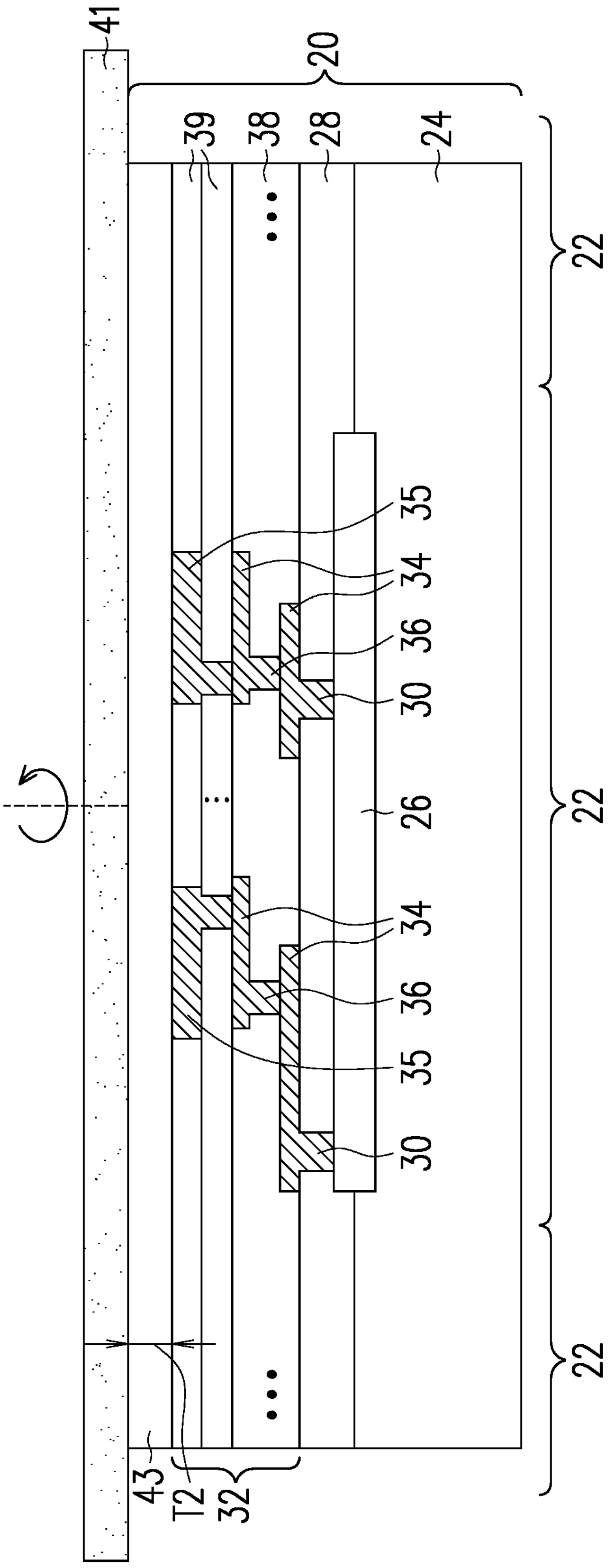

FIGS. 4B-1 and 4B-2 illustrate the formation of a bond film and the underlying structure in accordance with alternative embodiments. These embodiments are similar to the embodiments as shown in FIG. 4A, except that a planarization layer 43 is formed between bond film 42 and conductive features 35. In accordance with these embodiments, after the formation of conductive features 35, as shown in FIG. 4B-1, planarization layer 43 is deposited. Planarization layer 43 may be formed through a high-deposition-rate deposition process such as CVD, PECVD, or the like. The thickness T2 of planarization layer 43 is greater than thickness T1 of the subsequently deposited bond film 42, and may be in the range between about 2 kÅ and about 4 kÅ. The material of planarization layer 43 may be selected from SiON, SiO, SiN, SiC, SiCN, SiOCN, USG, and the like, and combinations thereof.

Since planarization layer 43 is thick, the surface roughness is high, for example, greater than about 50 Å. A planarization process is thus performed (using polishing pad 41) to reduce the surface roughness values Ra and Rq within specification, for example, to smaller than 1 Å, and may be lower than about 0.8 Å. It is to be appreciated that the polishing may be performed with wafer 20 being over polishing pad 41.

FIG. 4B-2 illustrates the formation of bond film 42. The formation process, the material, and the thickness are essentially the same as what have been described referring to FIG. 4A, and are not repeated herein. In accordance with some embodiments, while planarization layer 43 and bond film 42 may be selected from the same group of materials, the material of planarization layer 43 may be the same as, or different from, the material of bond film 42. For example, planarization layer 43 and bond film 42 may comprise same or different elements selected from Si, O, C, N, and H. When planarization layer 43 and bond film 42 comprise the same elements, the atomic percentages of the elements in planarization layer 43 may be the same as, or different from the atomic percentages of the corresponding elements in bond film 42. It is appreciated that when planarization layer 43 and bond film 42 are formed of the same materials, by planarizing planarization layer 43 and then forming bond film 42 using the selected method (such as PEALD) and process conditions as discussed above, better bonding may be achieved.

Figure 5A:
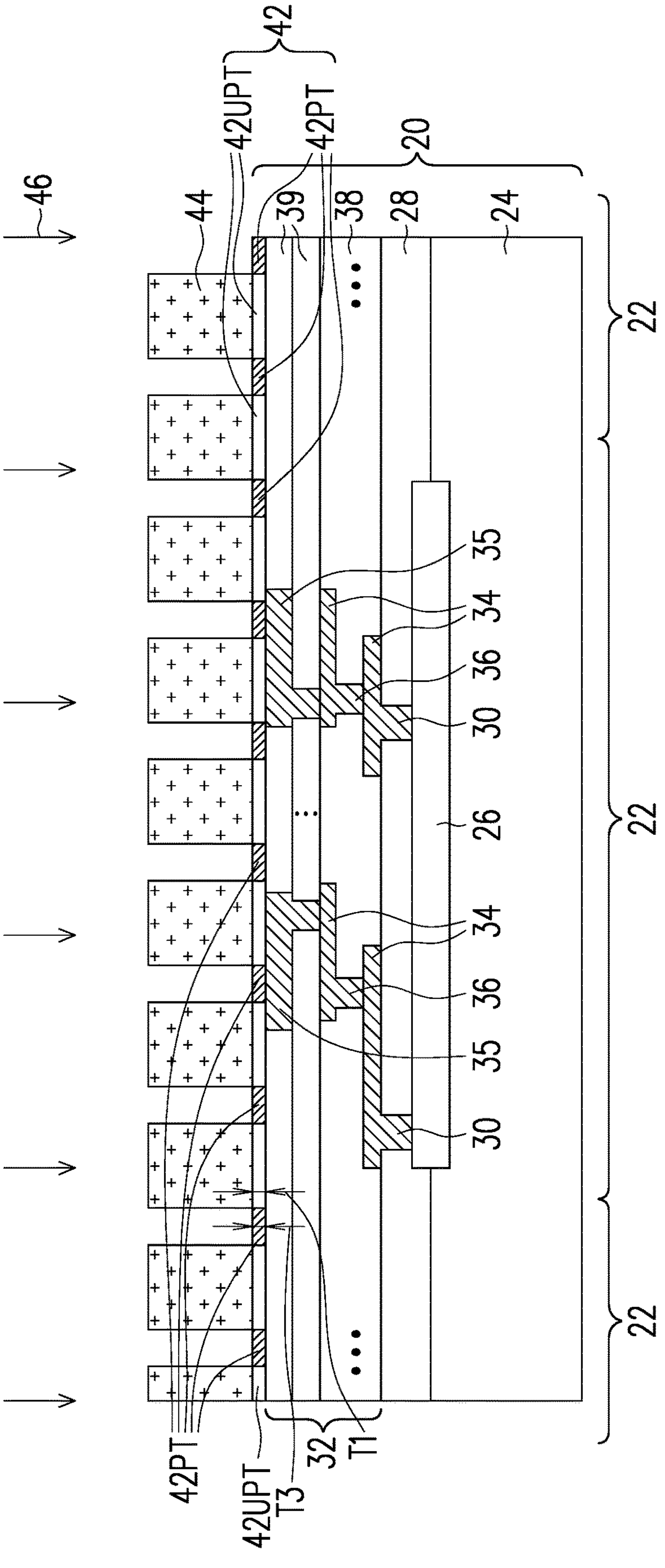
Figure 5B:
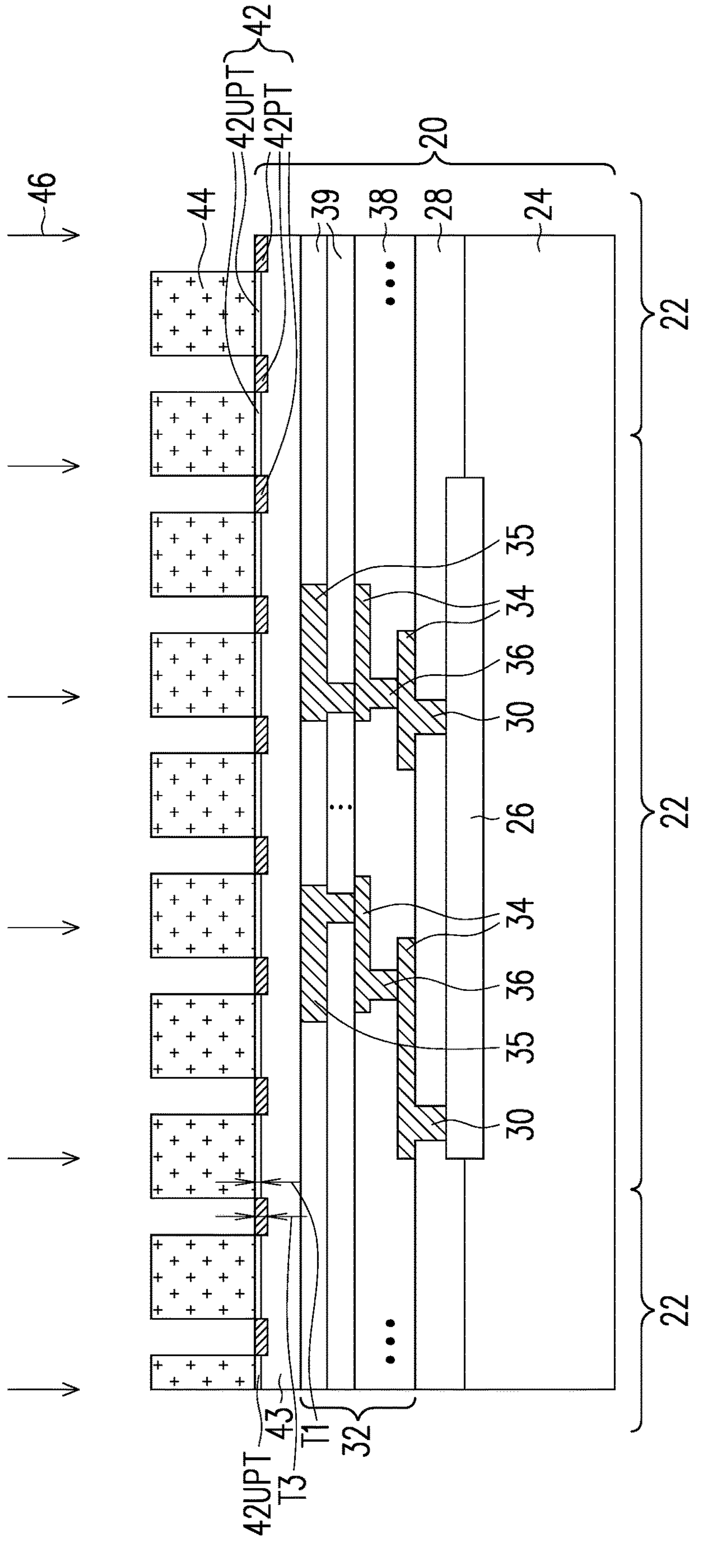

FIGS. 5A and 5B illustrate an optional treatment process in accordance with some embodiments. The respective process is illustrated as process 210 in the process flow 200 as shown in FIG. 18. In accordance with alternative embodiments, the treatment process is skipped. Referring to FIG. 5A, a patterned treatment mask 44 is formed. In accordance with some embodiments, the patterned treatment mask 44 may be or may comprise a photoresist. The patterned treatment mask 44 covers some portions of bond film 42, while leaving some other portions exposed.

A selective treatment process 46 is performed to selectively treat selected portions of bond film 42 that are exposed through the openings in treatment mask 44. In accordance with some embodiments, the treatment process 46 comprises a plasma treatment. The process gas for performing the plasma selective treatment process 46 may include nitrogen ($N_2$), oxygen ($O_2$), argon, or the like, or the combinations thereof. The treatment time may be shorter than about 60 seconds, and may be in the range between about 10 seconds and about 60 seconds.

In accordance with some embodiments, the treatment process 46 is performed with plasma being generated locally from the process gas. The treatment may be performed with an RF power lower than about 100 watts, and may be in the range between about 50 watts and about 100 watts. In accordance with some embodiments, a small bias power is applied, with the bias power being smaller than about 200 watts, such as between about 0 watts and about 200 watts. In accordance with alternative embodiments, the treatment process 46 is performed with no bias power applied. In accordance with yet alternative embodiments, the treatment process 46 is performed using remote plasma, wherein the plasma is generated in a treatment chamber separate from the treatment chamber in which the selective treatment process 46 is performed, and the remote plasma is conducted to the treatment chamber.

The selective treatment process 46 results in the light bombardment on the exposed surface portions of bond film 42. Some bonds in bond film 42 are thus broken. The treated portions of bond film 42 are referred to as treated portions 42PT hereinafter, and the untreated portions are referred to as untreated portions 42UPT. The treated portions 42PT may not be able to be distinguished visually from the untreated portions 42UPT. Accordingly, the patterns of the treated portions 42PT are referred to stealth patterns. The treated portions 42PT and the untreated portions 42UPT, however, may be distinguished from each other using tools such as X-ray Photoelectron Spectroscopy (XPS), Energy-Dispersive X-ray spectroscopy (EDX), or the like.

Figure 12A:
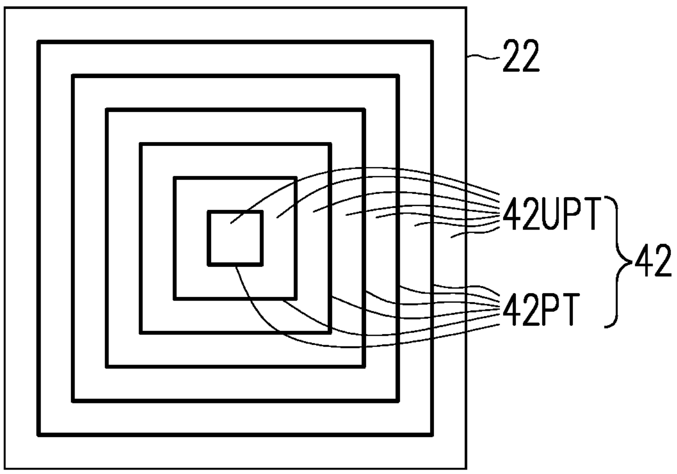
FIGS. 12A and 12B illustrate the treatment patters of bond films in device dies in accordance with some embodiments.
Figure 12B:
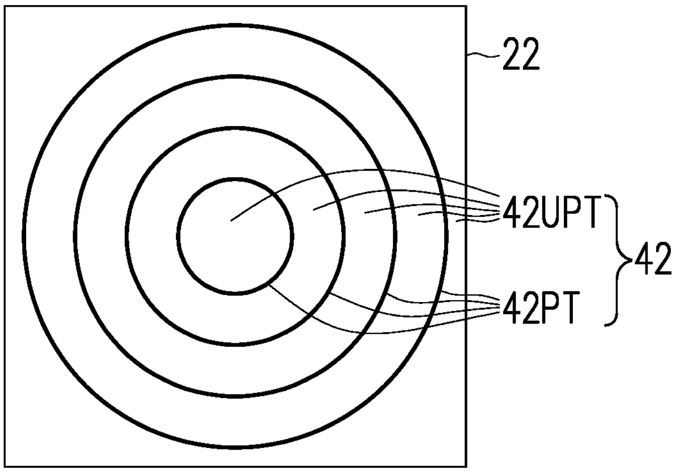

FIGS. 12A and 12B illustrate some example device dies 22 and the treated portions 42PT therein in accordance with some embodiments. The device dies 22 and the corresponding wafer 20 may be found referring to FIG. 13. It is appreciated that the treated portions 42PT may have any applicable pattern, providing that when the bond wave propagates, the treated portions 42PT are on the way of, and will be able to change the propagation behavior of, the bond wave, as discussed subsequently.

The treated portions 42PT may form a plurality of rings, which may be equally spaced. As shown in FIG. 12A, the treated portions 42PT form a plurality of square patterns, with outer squares encircling the respective inner squares. FIG. 12B illustrates that the treated portions 42PT form a plurality of circles. The treated portions 42PT may have any other shape including, and not limited to, hexagons, octagons, triangles, or the like. The rings of the treated portions may be full rings without breaks therein, or may have breaks therein.

Figure 13:
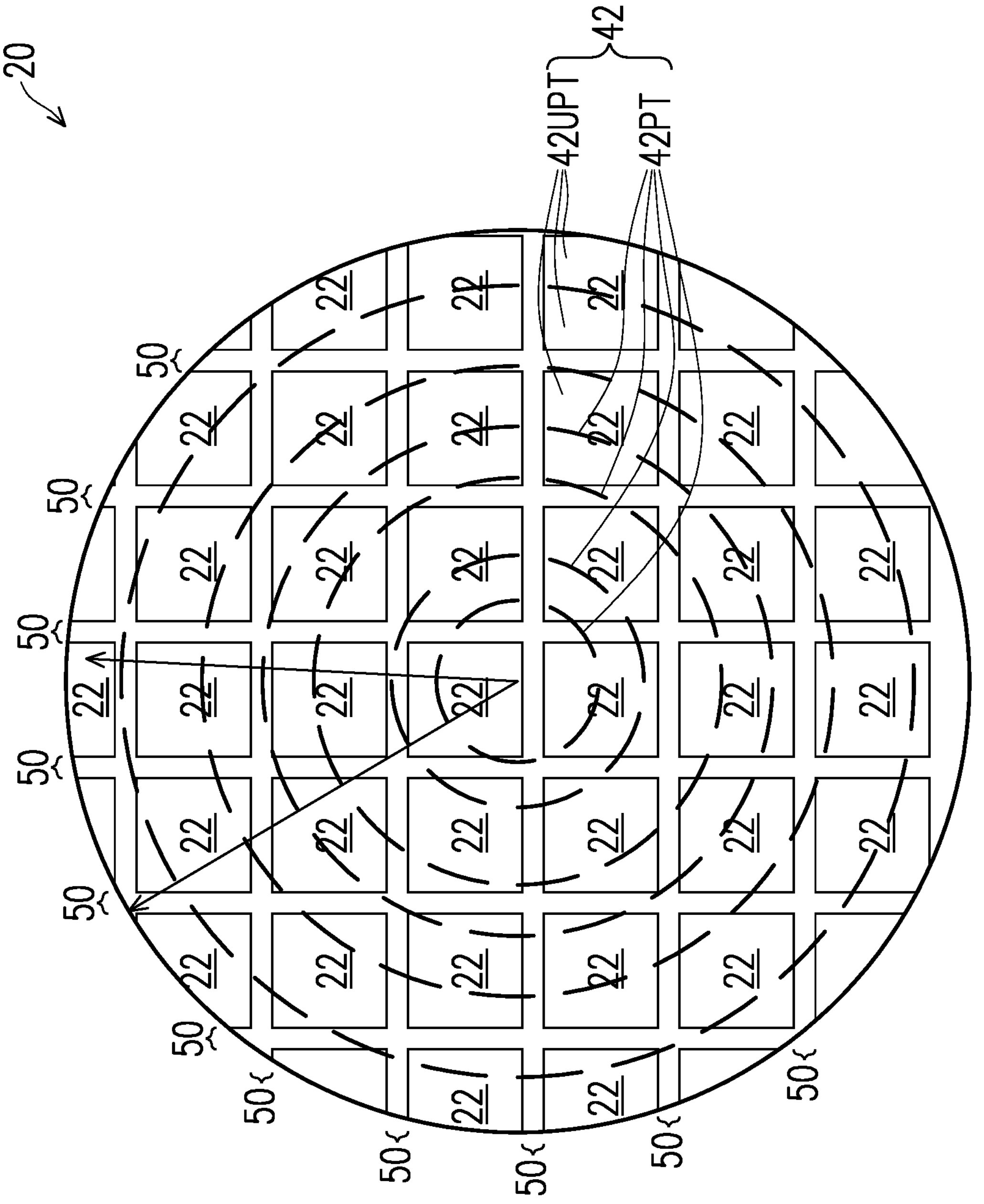
FIG. 13 illustrates the treated patterns in a wafer in accordance with some embodiments.

FIG. 13 illustrates an embodiment in which the treated portions 42PT are formed at wafer level, which is adopted when the bonding is performed through wafer-to-wafer bonding. The treated portions 42PT may have any other shape such as rings including, and not limited to, rectangles, circuits, hexagons, octagons, triangles, or the like, which rings may be broken or may be full rings that are not broken. One or more (or all) of the treated portions 42PT may extend into a plurality of device dies 22. The breaks in outer rings may not be aligned to the same radius with the immediate neighboring inner rings.

After the selective treatment, wafer 20 is taken out of the respective chamber (with vacuum break). The patterned treatment mask 44 (FIG. 5A) is then removed, for example, through an etching process, wherein ammonia water may be used as the etchant. Since in the preceding treatment process, some bonds in the treated portions 42PT of bond film 42 are broken, dangling bonds are formed. These dangling bonds may react with oxygen or moisture in the air to form an oxide. As a result, the treated portions 42PT have an oxygen atomic percentage $OAP_{42PT}$ higher than the oxygen atomic percentage OAP 42UPT in the untreated portions 42UPT.

In accordance with some embodiments, the treated portions 42PT have thickness T3 (FIG. 5A), which may be smaller than about 100 Å, and may be in the range between about 40 Å and about 100 Å. Furthermore, thickness T3 may be equal to, smaller than, or greater than the thickness T1 of bond film 42. Accordingly, the treated portions 42PT may be fully inside or may extend to the bottom or even lower than the bottom of bond film 42. Some portions of conductive features 35 may be (or may not be) treated.

FIG. 5B illustrates the treatment process in accordance with alternative embodiments. These embodiments are essentially the same as the embodiments in FIG. 5A, except that planarization layer 43 is formed. Accordingly, the treated portions 42PT may be fully inside or may extend to the bottom of bond film 42. The treated portions 42PT may also extend into planarization layer 43 in accordance with some embodiments.

Figure 6:
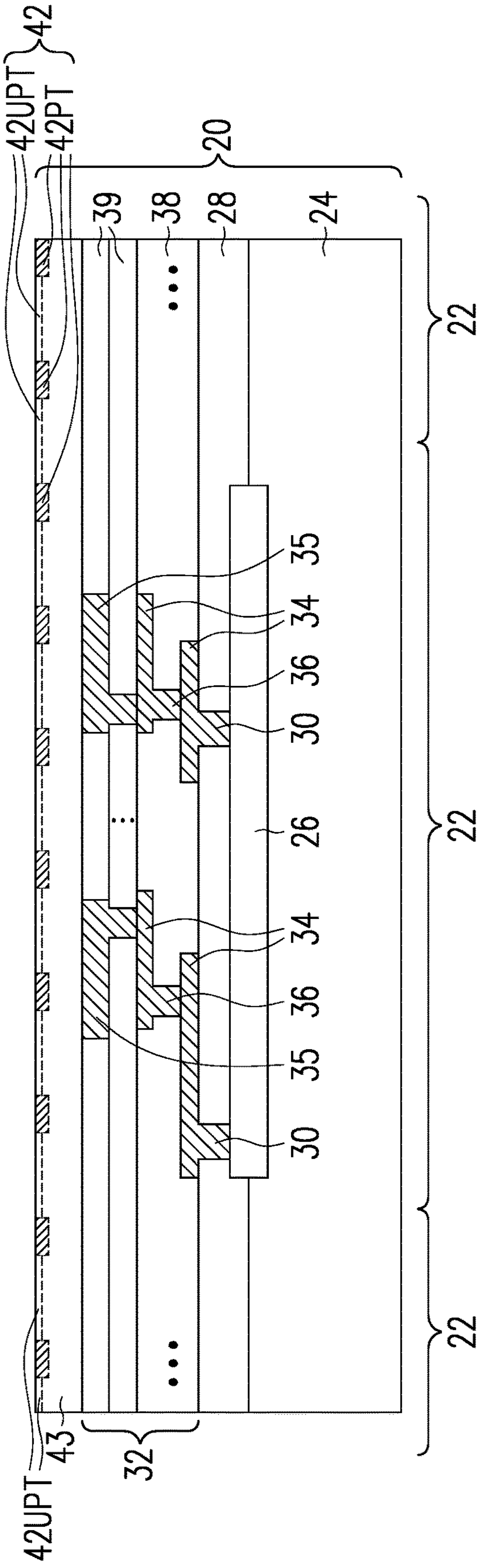

FIG. 6 illustrates the structure after the treatment process 46 is performed and the removal of treatment mask 44. In FIG. 6, planarization layer 43 is illustrated as being dashed to indicate that planarization layer 43 may be, or may not be formed. The untreated portions 42UPT are also illustrated as being dashed to indicate that the treatment process 46 may be, or may not be performed.

Figure 7:
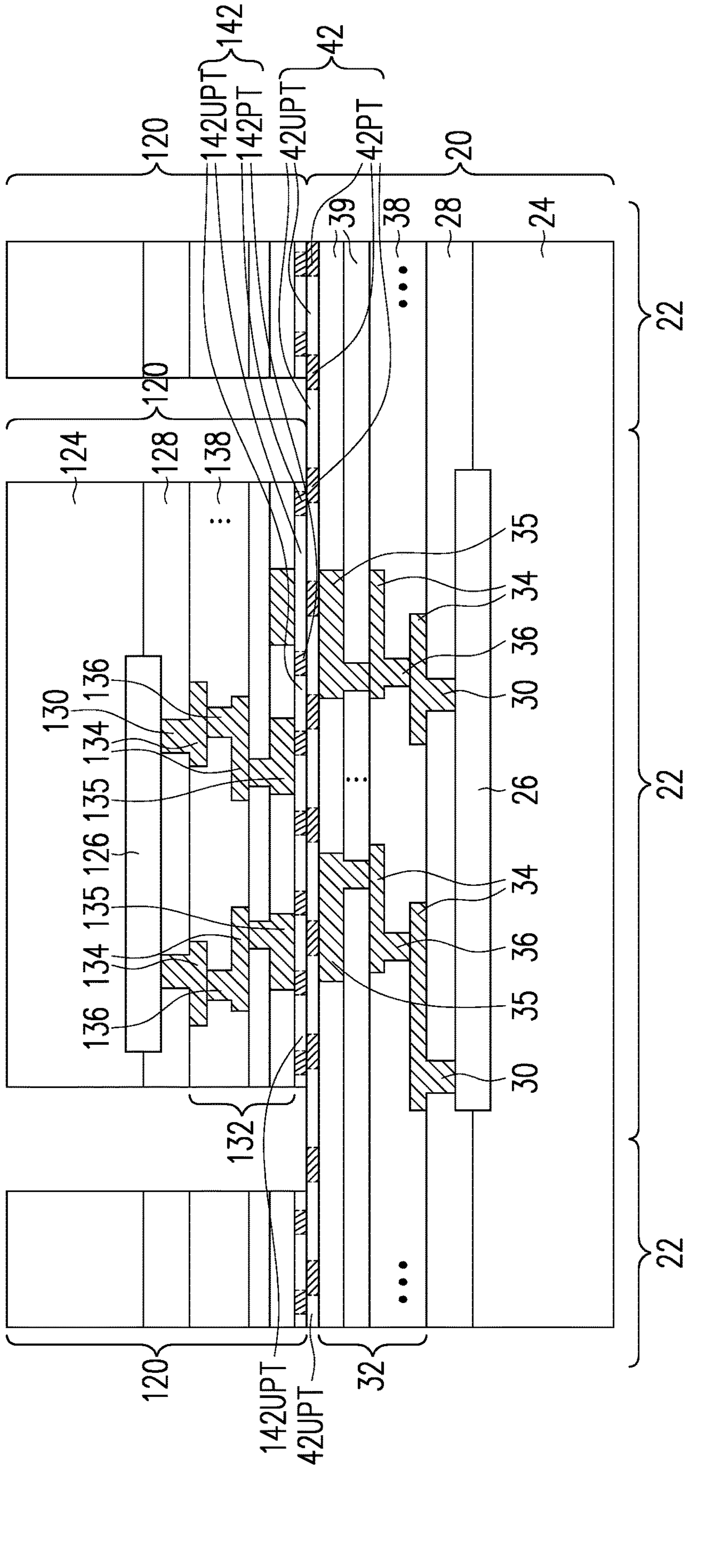

Referring to FIG. 7, package component 120 is formed, and is aligned to and pre-bonded to the device dies 22 in wafer 20. The respective process is illustrated as process 212 in the process flow 200 as shown in FIG. 18. In accordance with some embodiments, package component 120 is a device die, an interposer die, a package, or the like. Alternatively, package component 120 may be a device wafer, an interposer wafer, a reconstructed wafer including bonded device dies therein, or the like. FIG. 7 illustrates a device die as an example.

In some example embodiments, package component 120 has a similar structure as that of package component 20. The structures and the materials of the features in package component 120 may be found referring to the like features in wafer 20, with the like features in package component 120 being denoted by adding number "1" in front of the reference numbers of the corresponding features in wafer 20. For example, the substrate in wafer 20 is denoted as 24, and accordingly, the substrate in package component 120 is denoted as 124. Package component 120 may include integrated circuit devices 126, ILD 128, contact plugs 130, Interconnect structure 132, dielectric layers 138, metal lines 134, and vias 136. The details of these features may be similar to the corresponding features in wafer 20, and are not repeated herein.

Package component 120 further includes bond film 142 at a surface, and the selective treatment process may be, or may not be, performed on bond film 142 to form the treated portions 142PT, which are separated from each other by the untreated portions 142UPT. If performed, the selective treatment process may also adopt a process gas selected from the same group of candidate process gases used for selective treatment process 46.

During the pre-bonding, package component 120 is put into contact with wafer 20, with a pressing force applied to press package components 20 and 120 against each other. The pre-bonding may be performed at room temperature (between about 20° C. and about 25° C.), and a higher temperature may also be used.

The pre-bonding may start from putting the center of package component 120 into contact with wafer 20. The contacting propagates from the contacting point to the edges of package components 20 and 120, which propagation generates a bond wave propagating from the contacting point to the edges. With the bond wave propagating from the contacting point to the edges, the air between package components 20 and 120 is gradually squeezed out, so that no air bubble or moisture is trapped between package components 20 and 120. The air bubble or moisture, if trapped, will cause the corresponding parts of package components 20 and 120 not to bond to each other, and will result in yield loss.

By performing the selective treatment process 46 to form alternating treated portions 42PT and untreated portions 42UPT, and/or performing the selective treatment process to form alternating treated portions 142PT and untreated portions 142UPT, the surfaces of the corresponding bond film 42 (and/or bond film 142) have different compositions and different properties. The bond wave travels through the treated portions 42PT/142PT and untreated portions 42UPT/142UPT at different speed. Accordingly, the bond wave propagation is disrupted and discontinuous when running into the treated portions. This will eliminate Joule-Thomson effect, which causes moisture to be condensed in tiny pockets between package components 20 and 120, and tiny non-bond regions are adversely generated. Joule-Thomson effect is at least reduced, and possibly eliminated.

A plurality of package components 120 may be pre-bonded to wafer 20. After the pre-bonding, an annealing process is performed, for example, with Si—O—Si bonds being formed between bond films 42 and 142, so that bond films 42 and 142 are bonded to each other through fusion bonding. The respective process is illustrated as process 214 in the process flow 200 as shown in FIG. 18. In accordance with some embodiments, the annealing process is performed at a temperature in the range between about 250° C. and about 300° C. The annealing duration may be in the range between about 5 minutes and about 30 minutes in accordance with some embodiments.

Figure 8A:
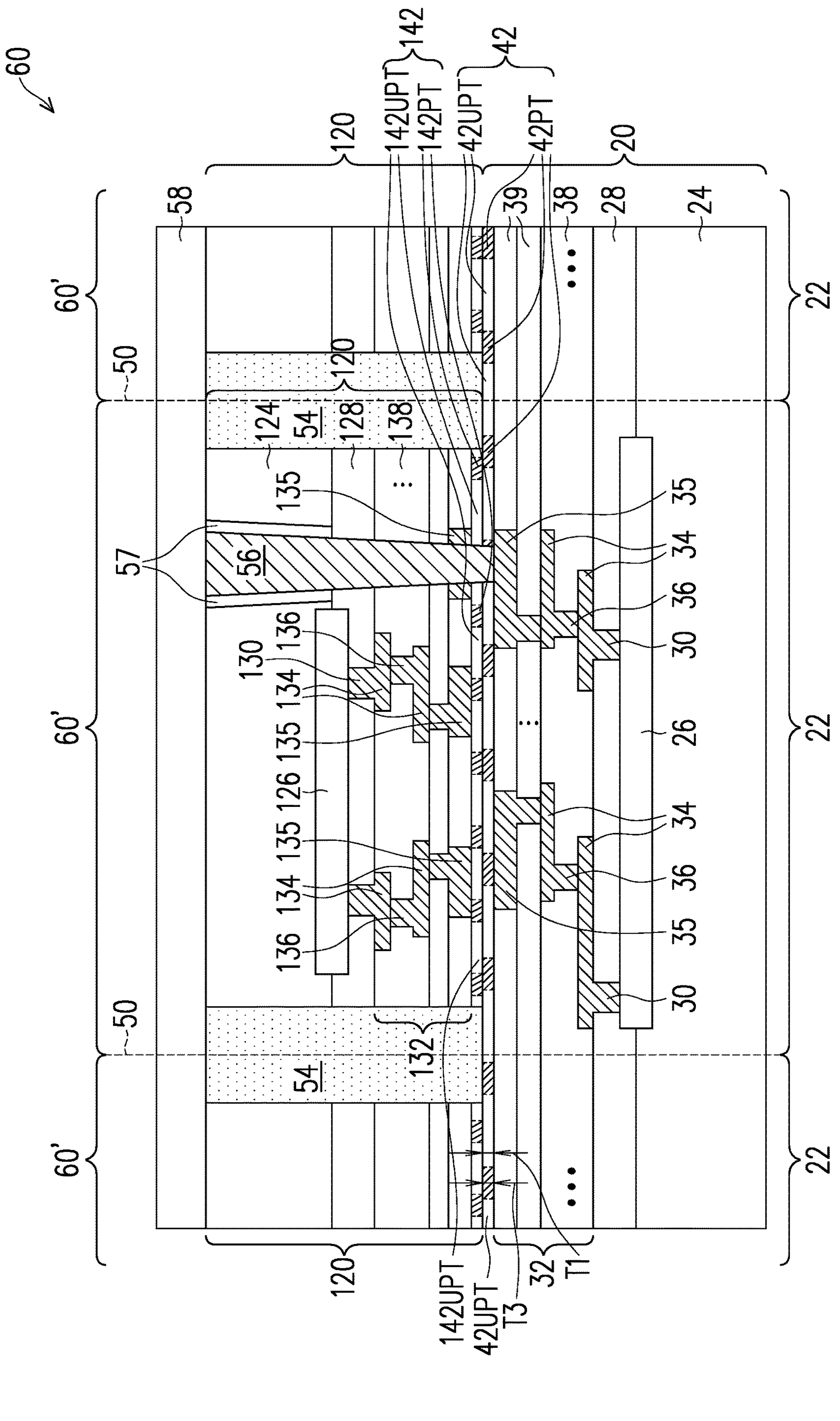

Referring to FIG. 8A, package components 120 are encapsulated in an encapsulant 54 (dielectric gap-filling regions). The respective process is illustrated as process 216 in the process flow 200 as shown in FIG. 18. In accordance with some embodiments, encapsulant 54 may comprise a dielectric liner and a dielectric filling material on the dielectric liner. The dielectric liner may be formed of or comprise silicon nitride, while the dielectric filling material may comprise silicon oxide. A planarization process such as a CMP process is performed to level the top surface of encapsulant 54 with the top surfaces of package components 120.

Contact plug 56 may be formed to penetrate through package component 120, and electrically connects metal pad 135 in package component 120 to conductive feature 35 in wafer 20. The respective process is illustrated as process 218 in the process flow 200 as shown in FIG. 18. Contact plug 56 penetrates through bond films 42 and 142, and may penetrate through and contact the treated portions 42PT and untreated portions 42UPT. A dielectric isolation ring 57 may be formed to electrically isolate contact plug 56 from semiconductor substrate 124.

Dielectric layer 58 may be formed to cover contact plug 56 and substrate 124. Reconstructed wafer 60 is thus formed. A singulation process may then be performed along scribe lines 50 to saw reconstructed wafer 60 and to form packages 60'. The respective process is illustrated as process 220 in the process flow 200 as shown in FIG. 18. Each of the packages 60' may include a package component 22 (such as a device die) bonded to package component 122 (such as a device die).

Figure 8B:
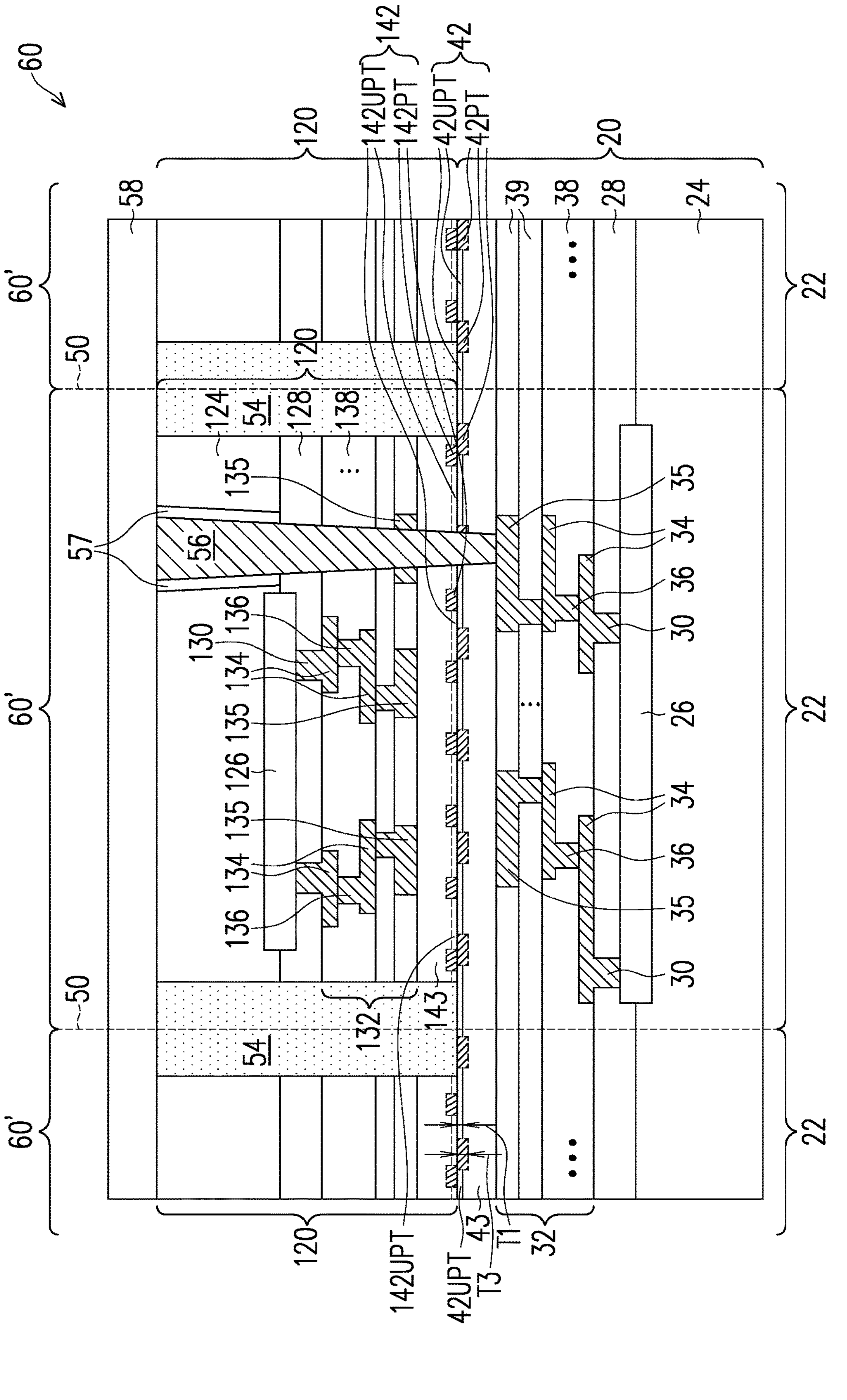
FIG. 8B illustrates the cross-sectional view of a package in accordance with alternative embodiments.

FIG. 8B illustrates the reconstructed wafer 60 and the packages 60' in accordance with alternative embodiments. These embodiments are similar to the embodiments in FIG. 8A, except that planarization layer 43 is formed in accordance with these embodiments.

Figures 2, 4B:
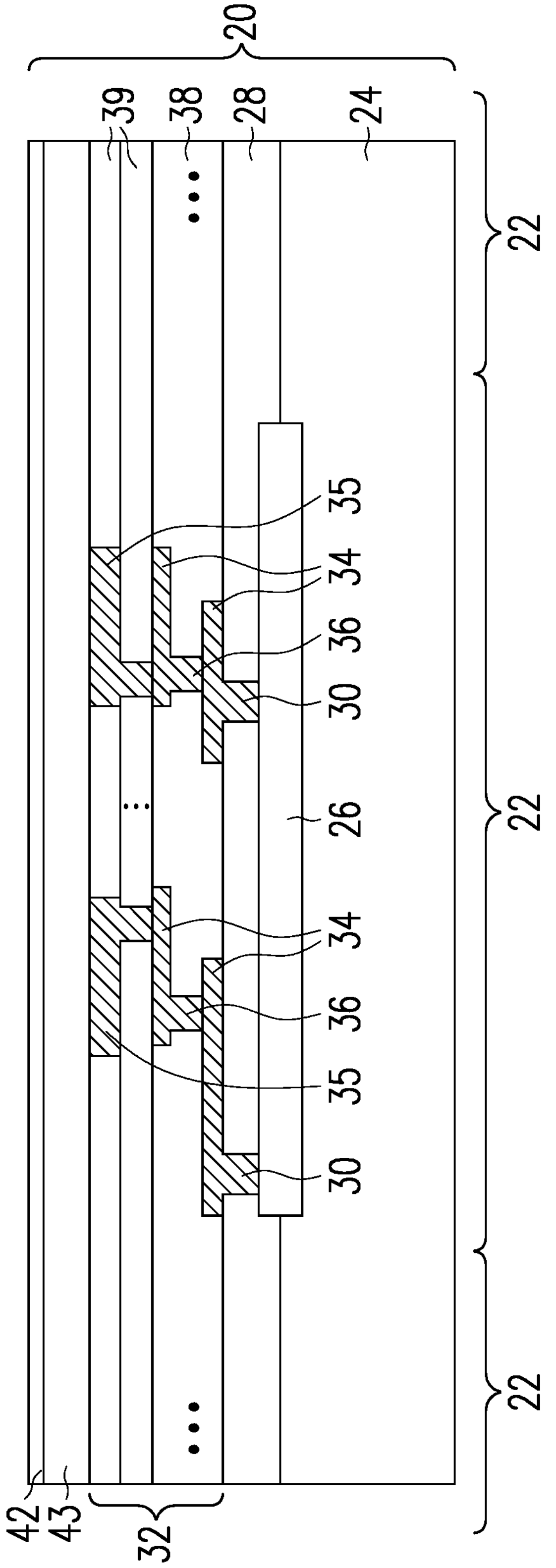
Figure 9:
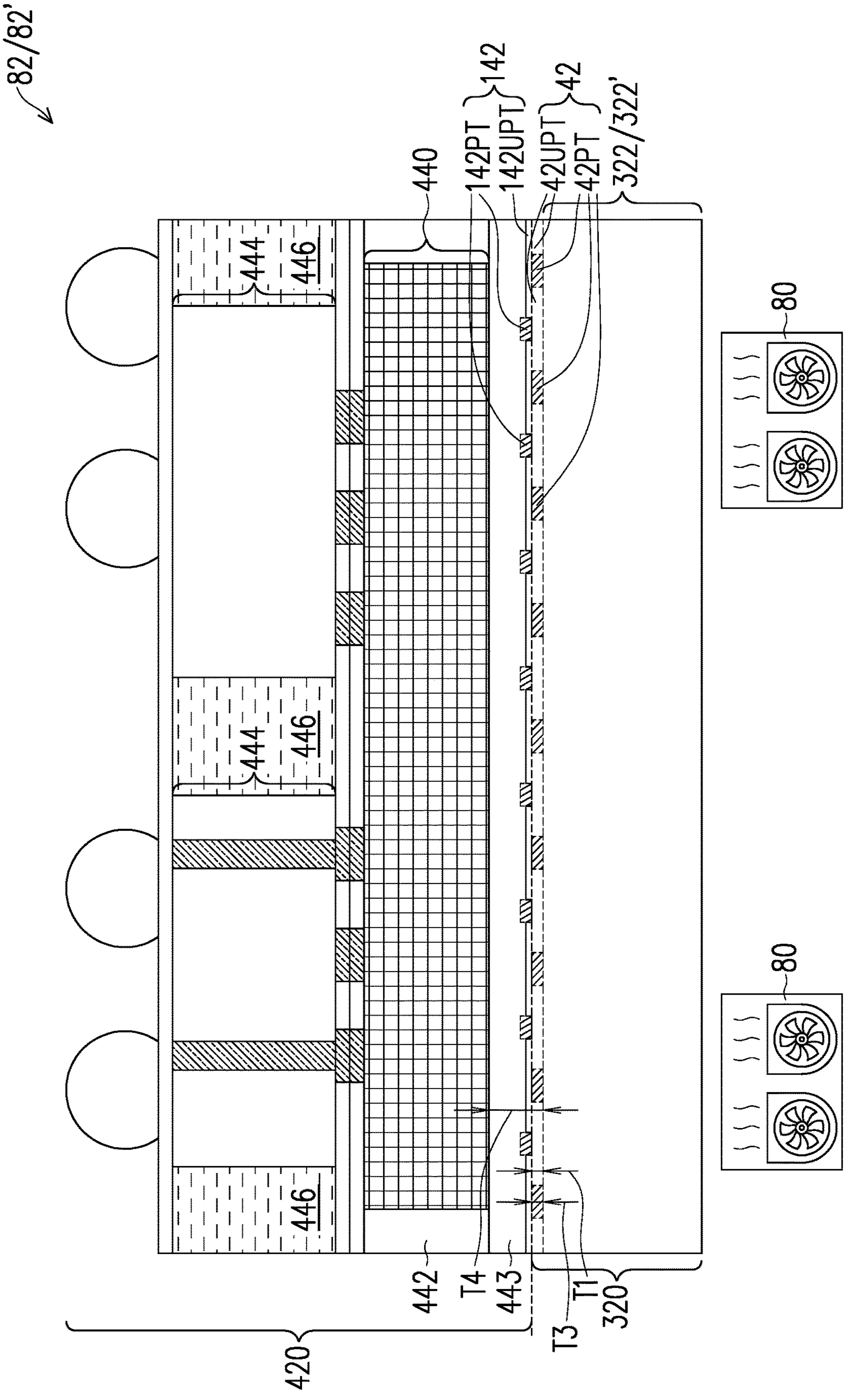
FIGS. 9, 10, and 11 illustrate the packages formed through a wafer-to-carrier bonding process, a chip-to-wafer bonding process, and a chip-to-chip bonding process, respectively, in accordance with some embodiments.

It is appreciated that the bonding of device chip to device wafer as shown in FIGS. 1 through 8A and 8B is an example, and the thin bond films may be used for the bonding of other package components. FIG. 9 illustrates a package in which a package component 420 is bonded to package component 320, which is a carrier in accordance with some embodiments. The formation of bond film 42 and the optional treated portions 42PT in carrier 320 are essentially the same as shown in FIGS. 4 and 5A, and are not repeated herein. In accordance with alternative embodiments, bond film 42 is not formed, and bond film 142 is bonded directly to the silicon in silicon wafer 322.

In accordance with some embodiments, carrier 320 comprises a crystalline silicon wafer 322. Bond film 42 is formed on silicon wafer 322. Carrier 320, when supplied, may have already had roughness values Ra and Rq smaller than about 1 Å, and hence no planarization process is performed on silicon wafer 322. Alternatively, if the roughness values Ra and Rq of silicon wafer 322 are higher than 1 Å, a planarization process may further be performed on silicon wafer 322 to reduce its roughness values Ra and Rq to be smaller than about 1 Å.

Package component 420 may be a chip sawed from a device wafer, a reconstructed wafer, or the like. For example, in the illustrated example, package component 420 is a reconstructed wafer including device dies 440 encapsulated in gap-filling regions 442, and device dies 444 encapsulated in gap-filling regions 446. Bond film 142 is formed as the surface layer of package component 420. The details of bond film 142 may be essentially the same as that of bond film 42 as discussed in preceding embodiments, and are not repeated herein. Planarization layer 443 may be formed, or may not be formed. The details of planarization layer 443 may be essentially the same as that of planarization layer 43, and are not discussed herein. After the bonding of package components 420 and 320, the resulting reconstructed wafer 82 is sawed into a plurality of packages, with one of the packages 82' illustrated in FIG. 9.

In accordance with some embodiments, in the package as shown in FIG. 9, the remaining silicon chip 322' of silicon wafer 322 is used as a heat sink for heat dissipation. For example, fans 80 are illustrated as being the heat-dissipation mechanism of package 82. Heat is dissipated from the dies in package component 420 to silicon chip 322', and is dissipated away. The heat dissipation efficiency is related to the thicknesses and the materials of the planarization layer 443 (if formed) and bond films 42 and 142. The heat resistance between device dies 442/444 and silicon chip 322' is proportional to the thickness T4 of the material between them. Accordingly, by making bond films 42 and 142 thinner, the heat resistance is reduced. The heat dissipation from the heat-generating device die 442 and 444 to silicon chip 322' is improved.

Figure 10:
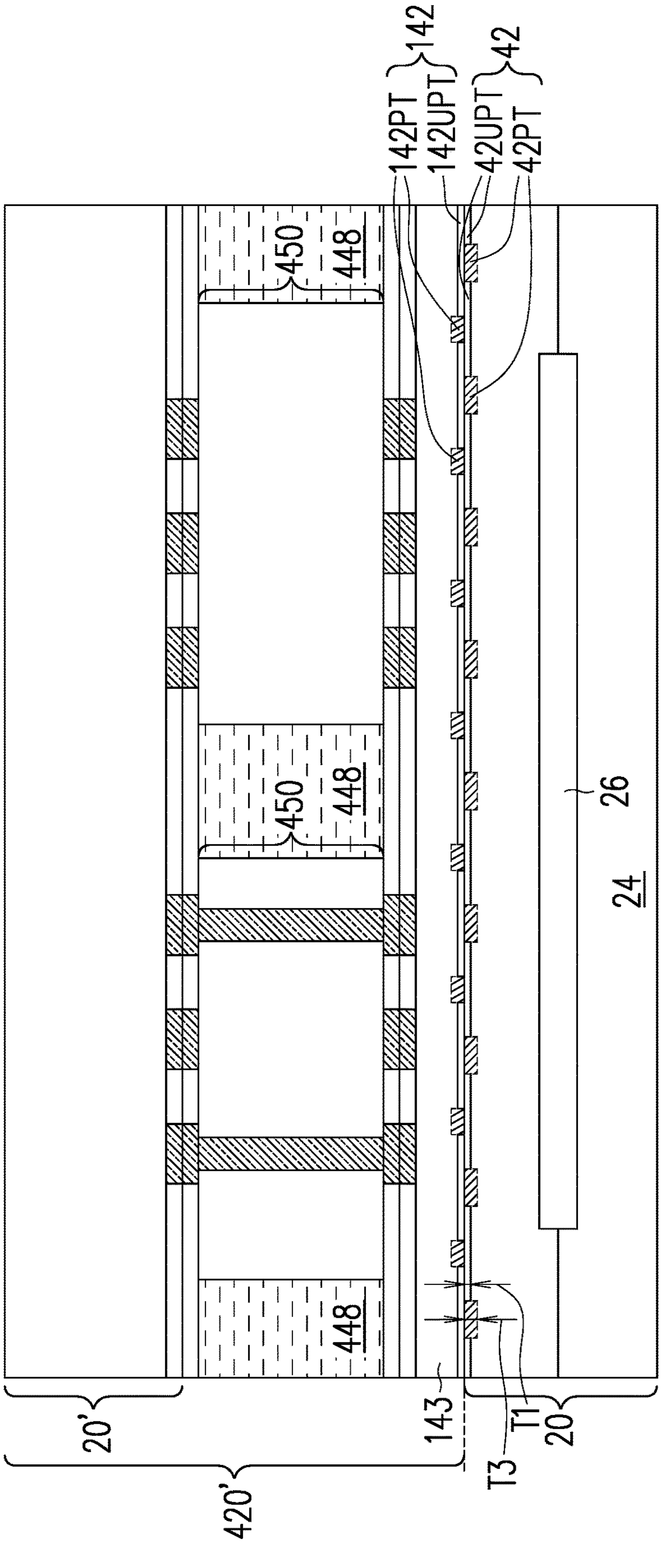

FIG. 10 illustrates an example of wafer-to-wafer bonding, in which reconstructed wafer 420', which includes device dies 450, gap-filling region 448, and device wafer 20', is bonded to device wafer 20, which is another device wafer. The bonding is performed through thin bond films 42 and 142, which may be treated (in selective treatment process 46) or not treated. Planarization layer 143 may be formed, or may be skipped.

Figure 11:
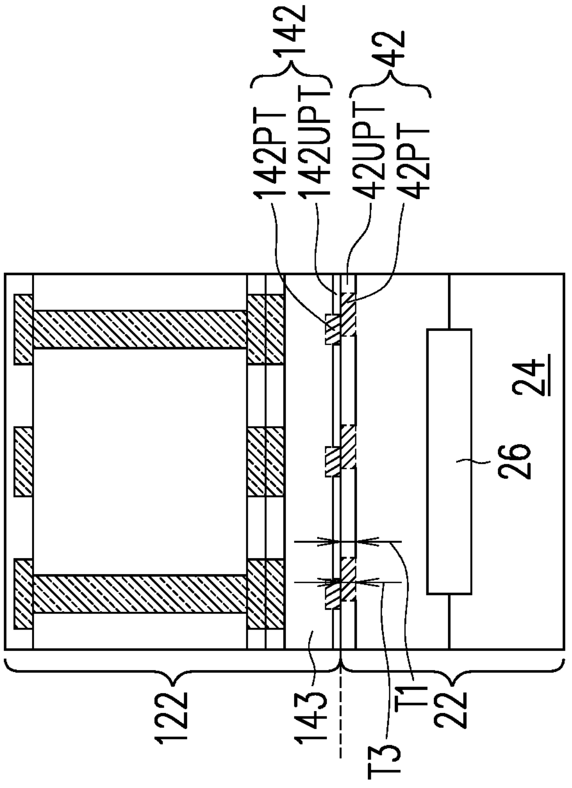

FIG. 11 illustrates an example of chip-to-chip bonding, in which chip 22 is bonded to chip 122. The bonding is performed through thin bond films 42 and 142, which may be treated or not treated. Planarization layer 143 may be formed, or may be skipped.

As addressed above, the selective treatment results in the treated portions to have a composition different from the composition of the untreated portions. The oxygen atomic percentage $OAP_{42PT}$ of the treated portions 42PT may be higher than the oxygen atomic percentage OAP 42UPT of the untreated portions 42UPT. The difference ($OAP_{42PT}$–$OAP_{42}$) may be greater than about 2 percent, and may be in the range between about 2 percent and about 10 percent.

Figure 14:
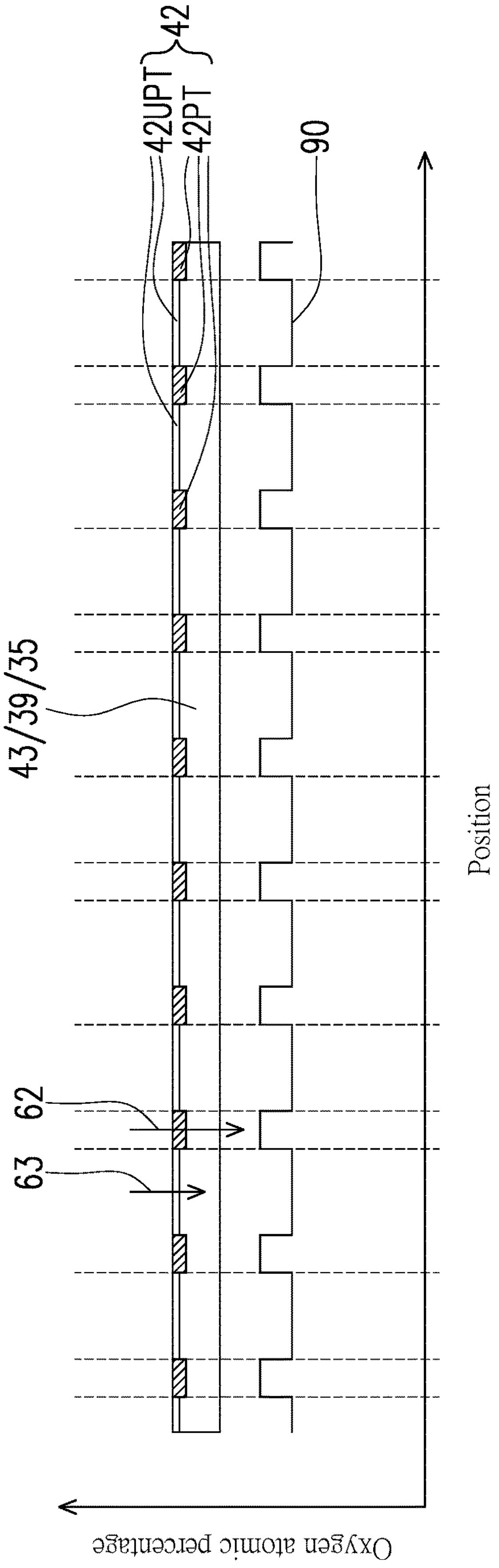
FIGS. 14 and 15 illustrate some oxygen distribution profiles in treated portions and neighboring untreated portions in accordance with some embodiments.

FIG. 14 schematically illustrates the oxygen atomic percentages in the treated portions 42PT as a function of their positions. The surface portion of bond film 42 is also shown in FIG. 14 to correspond the positions of the treated portions 42PT and untreated portions 42UPT to their oxygen atomic percentages. FIG. 14 illustrates line 90 to represent the oxygen atomic percentages. FIG. 14 shows that the oxygen atomic percentages in the treated portions 42PT are higher than the oxygen atomic percentages in the untreated portions 42UPT.

Figure 15:
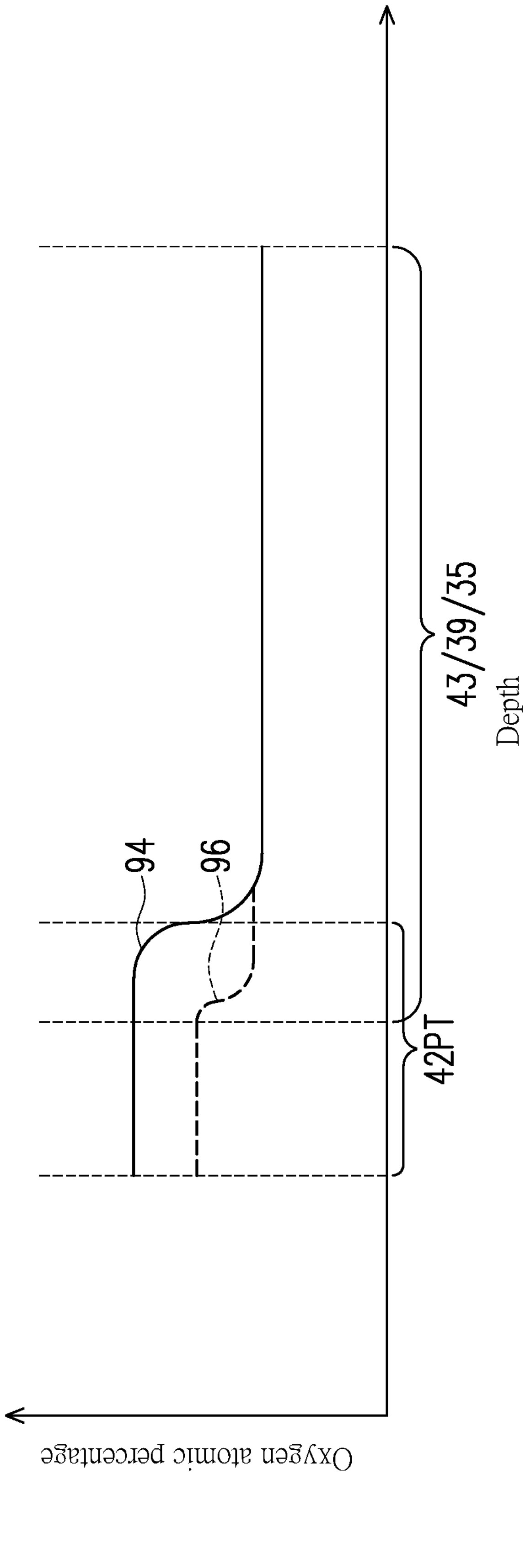

FIG. 15 schematically illustrates the oxygen atomic percentage in the treated portions 42PT and untreated portions as functions of their depths into bond film 42. The symbol "43/39/35" represent either planarization layer 43, or one of conductive features 35 and dielectric layer 39. The X-axis represents the position in the direction of arrows 62 and 63 in FIG. 14. Line 94 represents the oxygen atomic percentage in the path along arrow 62, and line 96 represents the oxygen atomic percentage in the path along arrow 63. It also shows that the treated portions 42PT may have higher oxygen atomic percentages, while the untreated portions 42UPT have lower atomic percentages. The difference in the compositions may be found using XPS, EDX, or the like.

The embodiments of the present disclosure have some advantageous features. By making bond films thinner, the heat resistance in the heat-dissipation path is reduced. For example, by reducing the thicknesses of bond films and planarization layers, the heat resistance may be reduced by about 85 percent. Reducing the thicknesses of the bond films also makes the roughness of the bond films to be low, allowing the bonding with high bond strength, without the need of planarizing the bond films. By using PEALD with controlled process conditions, the amount of OH groups at the surfaces of the bond films is increased, further resulting in increased bond strength. The bonding quality may further be improved by selectively treating some, but not all portions of the bond films.

In accordance with some embodiments, a method comprises forming feature for a first package component, wherein the forming the feature comprises a planarization process to level a top surface of the feature; depositing a silicon-containing dielectric layer over and contacting the feature, and as a surface feature of the first package component; and bonding a second package component to the silicon-containing dielectric layer through fusion bonding, wherein the silicon-containing dielectric layer has a same thickness in both steps of the depositing and the bonding. In an embodiment, the silicon-containing dielectric layer is deposited using a PEALD process.

In an embodiment, the second thickness of the silicon-containing dielectric layer is smaller than about 100 Å. In an embodiment, the second thickness of the silicon-containing dielectric layer is smaller than about 50 Å. In an embodiment, the silicon-containing dielectric layer has roughness values smaller than about 1 Å. In an embodiment, the method further includes selectively treating first portions of the silicon-containing dielectric layer, and leaving second portions of the silicon-containing dielectric layer untreated. In an embodiment, the first portions and the second portions are located alternatingly. In an embodiment, a treatment depth of the selectively treating is greater than the first thickness of the silicon-containing dielectric layer.

In an embodiment, the selectively treating comprises forming a treating mask over the silicon-containing dielectric layer; patterning the treating mask to expose the first portions of the silicon-containing dielectric layer, with the second portions being covered by the treating mask; performing a plasma treatment process on the first portions of the silicon-containing dielectric layer; and removing the treating mask. In an embodiment, the forming the feature comprises depositing a conductive material into openings in an additional dielectric layer; and performing the planarization process to level a first top surface of the conductive material with a second top surface of the additional dielectric layer.

In accordance with some embodiments, a structure comprises a first package component comprising a dielectric layer comprising a top surface; a silicon-containing dielectric layer over and contacting the dielectric layer, wherein the silicon-containing dielectric layer has a first thickness smaller than about 100 Å; and a second package component bonding to the silicon-containing dielectric layer through fusion bonding. In an embodiment, the thickness is smaller than about 50 Å. In an embodiment, the dielectric layer is free from conductive features therein. In an embodiment, the second package component comprises a silicon substrate, and wherein the silicon substrate is in physical contact with the first silicon-containing dielectric layer.

In an embodiment, the silicon-containing dielectric layer comprises first portions extending from a top surface of the first surface dielectric layer into the first surface dielectric layer, wherein the first portions have a first oxygen atomic percentage; and second portions separating the first portions from each other, wherein the second portions have a second oxygen atomic percentage lower than the first oxygen atomic percentage. In an embodiment, the first portions extend to a bottom surface of the first silicon-containing dielectric layer. In an embodiment, the first portions and the second portions are located alternatingly.

In accordance with some embodiments, a structure comprises a device die comprising a first semiconductor substrate; a dielectric layer; a conductive feature in the dielectric layer; a first bond film over and physically contacting the dielectric layer and the conductive feature, wherein the first bond film has a thickness smaller than about 50 Å; and a second package comprising a second bond film bonding to the first bond film; and a second semiconductor substrate over the second bond film. In an embodiment, the second semiconductor substrate physically contacts the second bond film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a feature for a first package component, wherein the forming the feature comprises a planarization process to level a top surface of the feature;

depositing a silicon-containing dielectric layer over and contacting the feature, and as a surface feature of the first package component;

selectively treating first portions of the silicon-containing dielectric layer, and leaving second portions of the silicon-containing dielectric layer untreated; and bonding a second package component to the silicon-containing dielectric layer through fusion bonding, wherein the silicon-containing dielectric layer has a same thickness in both steps of the depositing and the bonding.

2. The method of claim 1, wherein the silicon-containing dielectric layer is deposited using a Plasma Enhanced Atomic Layer Deposition (PEALD) process.

3. The method of claim 2, wherein the PEALD process has a flow rate ratio of $(N_2O+N_2)/(N_2O+N_2+O_2)$ higher than about 0.2.

4. The method of claim 1, wherein the same thickness of the silicon-containing dielectric layer is smaller than about 100 Å.

5. The method of claim 4, wherein the same thickness of the silicon-containing dielectric layer is smaller than about 50 Å.

6. The method of claim 1, wherein the silicon-containing dielectric layer has roughness values smaller than about 1 Å.

7. The method of claim 1, wherein the first portions and the second portions are located alternatingly.

8. The method of claim 1, wherein a treatment depth of the selectively treating is greater than the same thickness of the silicon-containing dielectric layer.

9. The method of claim 1, wherein the selectively treating comprises:

forming a treating mask over the silicon-containing dielectric layer;

patterning the treating mask to expose the first portions of the silicon-containing dielectric layer, with the second portions being covered by the treating mask;

performing a plasma treatment process on the first portions of the silicon-containing dielectric layer; and removing the treating mask.

10. The method of claim 1, wherein the forming the feature comprises:

depositing a conductive material into openings in an additional dielectric layer; and performing the planarization process to level a first top surface of the conductive material with a second top surface of the additional dielectric layer.

11. The method of claim 1, wherein the first portions of the silicon-containing dielectric layer are selectively treated using remote plasma.

12. The method of claim 1, wherein the first portions of the silicon-containing dielectric layer are selectively treated using local plasma without applying bias power.

13. A structure comprising:

a first package component comprising:

a dielectric layer comprising a top surface;

a silicon-containing dielectric layer over and contacting the dielectric layer, wherein the silicon-containing dielectric layer has a first thickness smaller than about 100 Å; and a second package component bonding to the silicon-containing dielectric layer through fusion bonding, wherein the dielectric layer and the silicon-containing dielectric layer collectively comprise:

first portions extending from an additional top surface of the silicon-containing dielectric layer into the dielectric layer, wherein the first portions have a first oxygen atomic percentage; and second portions separating the first portions from each other, wherein the second portions have a second oxygen atomic percentage lower than the first oxygen atomic percentage.

14. The structure of claim 13, wherein the first thickness is smaller than about 50 Å.

15. The structure of claim 13, wherein the dielectric layer is free from conductive features therein.

16. The structure of claim 13, wherein the first portions extend to a bottom surface of the silicon-containing dielectric layer.

17. A structure comprising:

a device die comprising:

a first semiconductor substrate;

a dielectric layer;

a conductive feature in the dielectric layer;

a first bond film over and physically contacting the dielectric layer and the conductive feature, wherein the first bond film comprises:

first portions extending from a top surface of the first bond film into the first bond film, wherein the first portions have a first atomic percentage of an element, and wherein the element is elected from the group consisting of nitrogen, oxygen, argon, and combinations thereof; and second portions separating the first portions from each other, wherein the second portions have a second atomic percentage of the element, with the second atomic percentage being lower than the first atomic percentage; and a second package comprising:

a second bond film bonding to the first bond film; and a second semiconductor substrate over the second bond film.

18. The structure of claim 17, wherein the first portions form a plurality of concentric rings.

19. The structure of claim 17, wherein the element comprises oxygen.

20. The structure of claim 17, wherein the first portions have patterns of concentric rings.

* * * * *